PULSE COUNTER DETECTOR

Filed Dec. 30, 1966 2 Sheets-Sheet 1

Inventor
HARRY J. HUMMEL
BY Mueller, Aichele & Rauner
ATTYS

Inventor
HARRY J. HUMMEL
BY Mueller, Aichele & Rauner
ATTYS.

United States Patent Office 3,473,133

Patented Oct. 14, 1969

3,473,133

PULSE COUNTER DETECTOR

Harry J. Hummel, West Chicago, Ill., assignor to Motorola, Inc., Franklin Park, Ill., a corporation of Illinois Filed Dec. 30, 1966, Ser. No. 606,224
Int. Cl. H03d 3/04
U.S. Cl. 329—126 8 Claims

ABSTRACT OF THE DISCLOSURE

A pulse counter detector is provided having a monostable multivibrator to develop equal area pulses. The equal area pulses are integrated and amplified in a differential amplifier to develop an audio output. The circuit does not include inductances and therefore is adaptable to be manufactured as an integrated circuit.

BACKGROUND OF THE INVENTION

Detectors, such as the Foster-Seeley, previously used in frequency modulation receivers to demodulate the FM signal contain inductances and therefor cannot be manufactured in an integrated circuit form. One form of detection which is adapted to be manufactured as an integrated circuit is the pulse counter detector in which constant energy pulses are developed by differentiating a square wave input from the limiter. However, the constancy of the energy of the differentiated pulses is dependent upon the square wave input rise time and amplitude and adequate control of this rise time and amplitude over a wide range of signal levels is not practical. This is particularly true when detecting frequency modulation deviations which are only 1% of the center frequency. It is also desirable that the amplitude modulation or noise transients which may be present with the frequency modulation signal be cancelled.

SUMMARY OF THE INVENTION

It is therefore, an object of this invention to provide an improved pulse counter detector for frequency modulation signals which is readily adaptable to manufacture as an integrated circuit.

Another object of this invention is to provide a pulse counter detector for frequency modulation signals capable of detecting frequency modulation deviations which are as low as 1% of the center frequency.

Another object of this invention is to provide a pulse counter detector for frequency modulation signals wherein the desired FM modulation is detected and wherein the amplitude modulation and noise transients are cancelled.

In practicing the invention a pulse counter detector is provided including a monostable multivibrator for producing constant energy pulses in response to triggering signals applied thereto. The triggering signals are derived from the square wave output signals from the frequency modulation receiver limiter. The monostable multivibrator provides constant energy output pulses which are independent of the rise time and amplitude of the square wave pulses from the limiter. Two outputs are obtained from the monostable multivibrator, one of which is coupled to a first integrating circuit and the second of which is coupled to a second integrating circuit through a phase inverter. The output from each integrator is coupled to separate inputs of a differential amplifier stage. The differential amplifier stage is coupled to an audio stage which may be a single ended stage or a push-pull stage. By this means the desired frequency modulation is derived differentially whereas the amplitude modulation or noise transients are common mode and thus are cancelled.

The invention is illustrated in the drawings of which:

DESCRIPTION OF THE PREFERRED EMBODIMENTS

Figure 1:
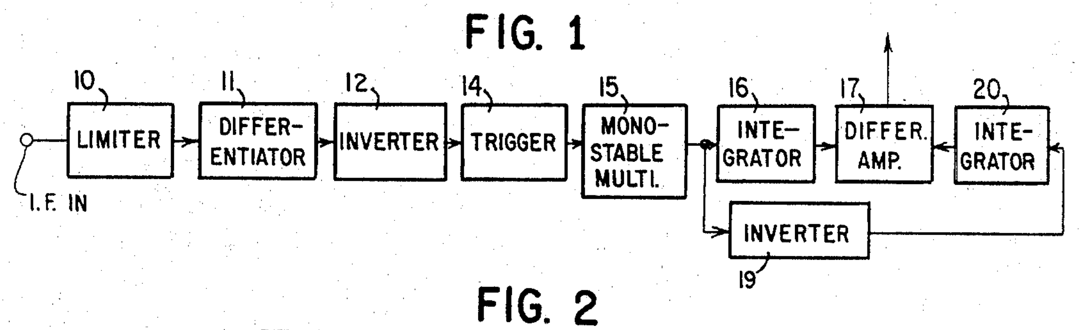
FIG. 1 is a block diagram of the system described in the application.

In FIG. 1 there is shown a block diagram of a circuit incorporating the features of this invention. A frequency modulated IF signal is applied to limiter 10 where it is amplified and limited to produce a square wave output signal. The square wave signal is differentiated in differentiator 11 to develop a differentiated signal having spikes of a positive and negative polarity. The differentiated signal is clipped in a known manner in differentiator 11 to develop a trigger signal having spikes of one polarity. The trigger signal is coupled to trigger 14 through phase inverter 12, which produces pulses of the proper polarity to actuate trigger 14. Trigger 14 is responsive to the trigger signal to switch monostable multivibrator 15 to its unstable state, where it remains for a predetermined period of time and then returns to a stable state. Monostable mulivibrator 15 produces a monostable multivibrator signal having output pulses with an energy content independent of the rise time and amplitude of the square wave output from limiter 10. The monostable multivibrator signal pulses are coupled to integrator 16 and integrated therein to develop an integration signal. The amplitude of the integration signal is a function of the frequency of the frequency modulated IF signal applied to output limiter 10 and thus the frequency modulated signal is changed to an amplitude modulated signal.

The pulses from monostable multivibrator 15 are also coupled to integrator 20 through phase inverter 19 which reverses the phase of the pulses. Phase reversal can also be achieved by coupling to a different portion of the monostable multivibrator circuit in a known manner. The integration signals from integrators 16 and 20 are coupled to separate inputs of differential amplifier 17 where they are differentially amplified to develop an audio frequency output signal which may be coupled to other circuits of the receiver.

Figure 2:
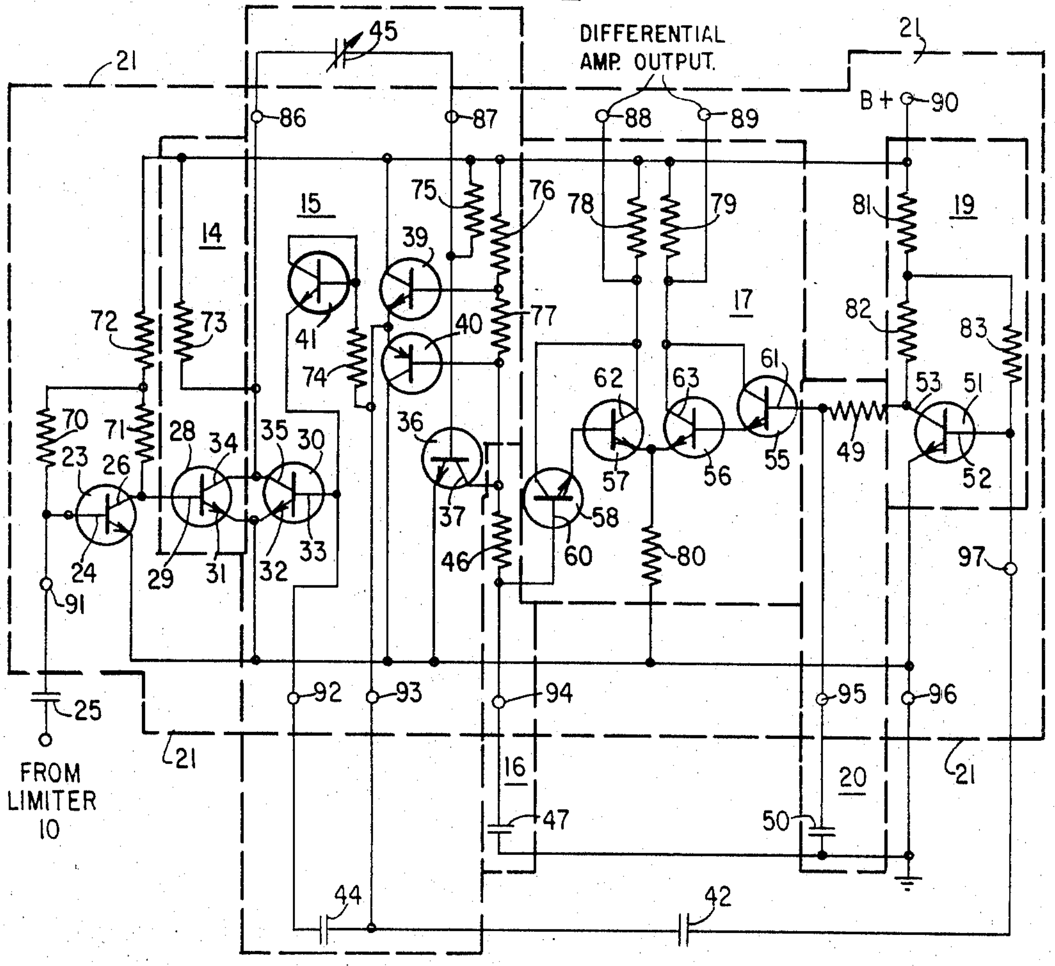
FIG. 2 is a schematic of a portion of FIG. 1.

Referring to FIG. 2, there is shown a schematic of a portion of the circuit of FIG. 1. The portion of the circuit enclosed by dashed line 21 represents that portion of the circuit which is readily manufactured in any integrated form. Certain portions of the circuit, such as capacitors which are not readily formed in an integrated circuit, are incorporated as discrete components coupled to the integrated circuit.

Input signals from limiter 10 are coupled to base 24 of transistor 23 through coupling capacitor 25 and terminal 91. Capacitor 25 and the input impedance of transistor 23 form the differentiator 11. Clipping of the unwanted positive polarity spikes occurs because transistor 23 is biased into saturation. Tranisistor 23 amplifies and reverses the polarity of the input signal to develop a triggering signal having the proper polarity to trigger multivibrator 15. The output of inverter 12 is coupled from collector 26 of transistor 23 to base 29 of trigger transistor 28. Trigger transistor 28 has its collector 34 coupled to collector 35 of transistor 30 and its emitter 31 coupled to emitter 32 of transistor 30. Transistor 30 is one of the switching transistors of the monostable multivibrator circuit 15, the other being transistor 36. The triggering pulse applied to transistor 28 acts to switch monostable multivibrator 15 to its unsable state where it remains for a predetermined period of time and then returns to its stable state. The unsable period of the monostable multivibrator is chosen to be less than the period of the highest frequency of the frequency modulated IF signal. Thus the monostable multivibrator signal consists of equal energy pulses having an instantaneous pulse repetition rate equal to the instantaneous frequency of the frequency modulated IF signal. The monostable multivibrator signal is developed on collector 37 of transistor 36 and is coupled to terminal 93 through emitter followers 39 and 40 which act to reduce loading on the multivibrator circuit. The output signal is also coupled to base 33 of transistor 30 through resistor 74 and transistor 41 connected as a diode to provide the proper feedback for multivibrator action. Capacitor 44 positioned outside of the integrated circuit portion and connected to terminals 92 and 93 acts as a "speed up" capacitor. Variable capacitor 45, also positioned outside of the integrated circuit and connected to terminals 86 and 87, together with resistor 75, provides the necessary capacitance for proper timing of the monostable multivibrator circuit.

The multivibrator signal appearing at collector 37 of transistor 36 is coupled through resistor 46 to base 60 of transistor 58. Resistor 46 and capacitor 47, positioned outside of the integrated circuit and connected to terminal 94, form an integrator to integrate the multivibrator signal. The multivibrator signal appearing on terminal 93 is coupled from terminal 93 through coupling capacitor 42 to terminal 97. Terminal 97 is coupled to base 52 of transistor 51. Transistor 51 is a phase inverter and the signal appearing on collector 53 of transistor 51 is inverted in phase from the multivibrator signal appearing at collector 37 of transistor 36 and is coupled to base 61 of transistor 55 through resistor 49. Resistor 49 and capacitor 50, positioned outside of the integrated circuit and connected to terminal 95, form a second integrating circuit to integrate the inverted multivibrator signals.

The pair of integrated multivibrator signals are amplitude modulated, with the amplitude modulation being a function of the modulation frequency of the frequency modulation signal, and are applied to separate inputs of differential amplifier 17. If the frequency increases, the output pulses from monostable multivibrator 15 increase in frequency and the amplitude of the integrated multivibrator signal increases. Differential amplifier 17 acts to reject the common mode amplitude modulation and noise transients which may be present on the input signal. Output terminals 88 and 89 may be connected to an audio amplifier which may be either push-pull or single ended as desired.

Figure 3:
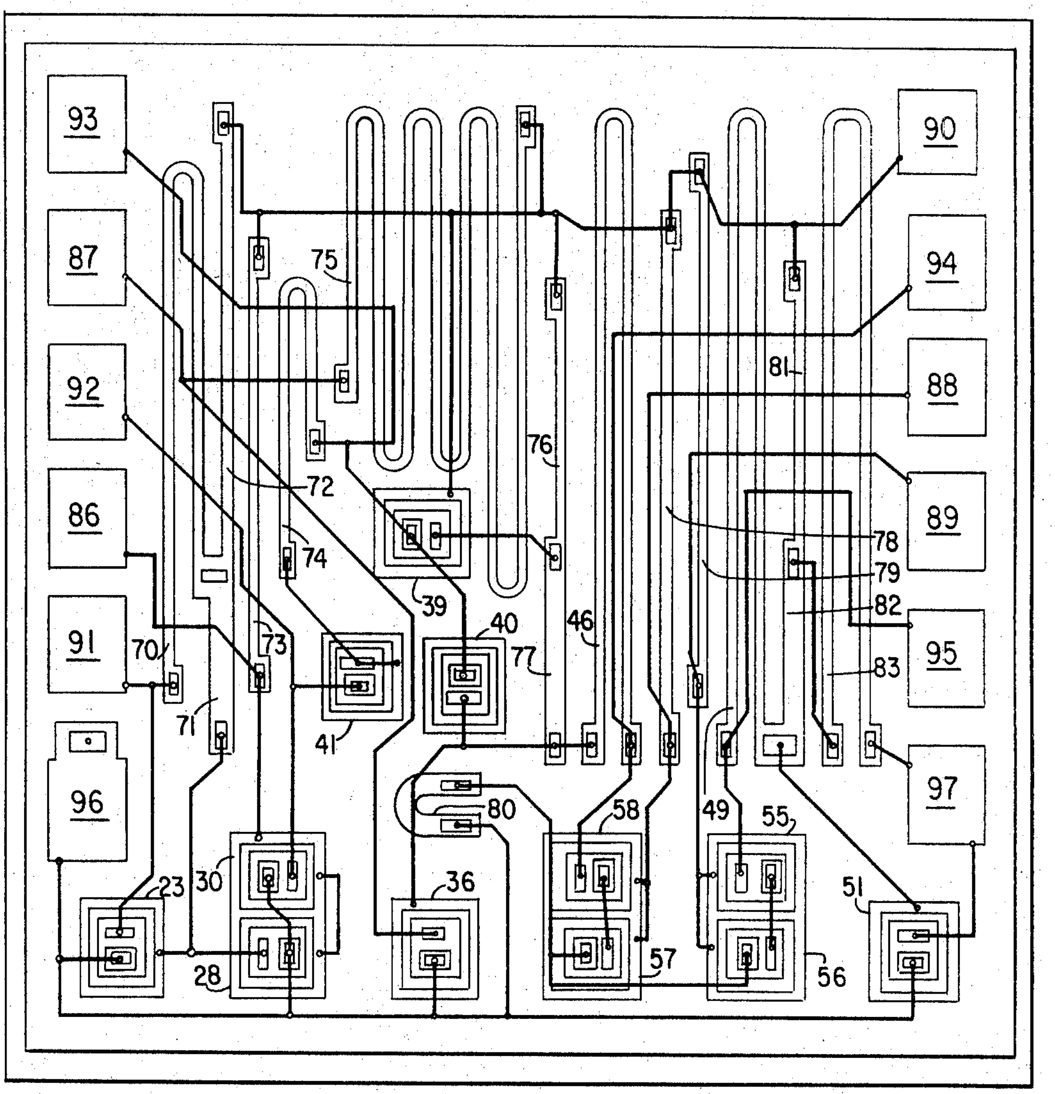
FIG. 3 is a drawing of an integrated circuit die showing a portion of the circuit of FIG. 2 in an integrated form.

FIG. 3 illustrates a silicon die having the circuit enclosed within dashed lines 21 of FIG. 2 formed as an integrated circuit therein. Resistors 70 to 83 and terminals 86 to 96 have been given reference numerals so that they may be identified in each of FIGS. 2 and 3. Capacitors, which are not readily formed in an integrated circuit structure, have been positioned outside of the integrated circuit structure and are coupled to the appropriate terminal formed therein. The connection between the various portions of the integrated circuit structure of FIG. 3 are shown by heavy lines instead of the relatively wide conducting paths normally used in order to make the structure of the integrated circuit more readily understood. The connection between ground and the collector of transistor 40 is made through the substrate of the integrated circuit die and is not shown in FIG. 3.

Thus, a simple form of a pulse counter detector which may be readily formed as an integrated circuit and which does not use inductance has been shown. This structure makes use of a monostable multivibrator to form pulses of equal energy which are integrated and differentially amplified. The circuit gives performance equivalent to a Foster-Seeley discriminator and will detect frequency modulation signals having deviations as low as 1% of the center frequency.

What is claimed is:

1. A pulse counter detector for detecting a frequency modulated signal, including in combination, monostable multivibrator means, first circuit means coupled to said monostable multivibrator means for receiving the frequency modulated signal, said first circuit means being responsive to the frequency modulated signal to trigger said monostable multivibrator means and thereby generate a monostable multivibrator signal, first integration circuit means coupled to said monostable multivibrator means for integrating said monostable multivibrator signal to develop a first integration signal, second integration circuit means, second circuit means coupled to said monostable multivibrator means and said second integration circuit means and being responsive to said monostable multivibrator signal to couple a phase inverted monostable multivibrator signal to said second integration circuit means, said second integration circuit means integrating said phase inverted multivibrator signal to develop a second integration signal, and differential amplifier means coupled to said first and second integration means for differentially amplifying said first and second integration signals.

2. The pulse counter detector of claim 1 wherein, said second circuit means includes phase inverting means for inverting the phase of said monostable multivibrator signal to develop said phase inverted multivibrator signal.

3. The pulse counter detector of claim 1 wherein said first circuit means includes differentiation means for differentiating the frequency modulated signal to develop a trigger signal having spikes of one polarity, and trigger circuit means coupling said differentiation means to said monostable multivibrator means, said trigger circuit means being responsive to said trigger signal to cause said monostable multivibrator means to switch to its unstable state.

4. The pulse counter detector of claim 1 wherein said first circuit means includes limiter means coupled to said monostable multivibrator means and receiving the frequency modulated signal, said limiter means acting to amplify said frequency modulated signal to develop a square wave signal having an instantaneous repetition rate equal to the instantaneous frequency of the frequency modulated signal, said first circuit means being responsive to said square wave signal to cause said monostable multivibrator means to switch to its unstable state.

5. The pulse counter detector of claim 3 wherein said input circuit means further includes limiter means coupled to said differentiation means in receiving the frequency modulated signal, said limiter means acting to amplify the frequency modulated signal to develop a rectangular wave signal having an instantaneous repetition rate equal to the instantaneous frequency of the frequency modulated signal, said differentiation means acting to differentiate said square wave signal to develop a differentiated signal having positive and negative excursions, said differentiation means further including clipping means for removing excursions of one polarity to thereby develop a triggering signal having excursions of the other polarity.

6. The pulse counter detector of claim 5 wherein said second circuit means includes phase inverting means coupled to said monostable multivibrator means and said second integration means for inverting the phase of said monostable multivibrator signal to develop said phase inverted multivibrator signal, said differential amplifier means having a first input coupled to said first integration means for receiving said first integration signal and a second input coupled to said second integration means for receiving said second integration signal.

7. A pulse counter detector for detecting a frequency modulated signal, including in combination, an integrated circuit die having formed therein a plurality of transistors and resistors, said plurality of transistors and resistors being interconnected to form; a monostable multivibrator circuit, first circuit means coupled to said monostable multivibrator circuit for receiving the frequency modulated signal, first integration circuit means coupled to said monostable multivibrator means, second integration circuit means, second circuit means coupling said monostable multivibrator means to said second integration circuit means, and differential amplifier means; said first circuit means being responsive to the frequency modulated signal to trigger said monostable multivibrator means and thereby generate a monostable multivibrator signal, said first integration circuit means integrating said monostable multivibrator signals to develop a first integration signal, said second circuit means being responsive to said monostable multivibrator signal to couple phase inverted monostable multivibrator signals to said second integration circuit means, said second integration circuit means acting to integrate said phase inverted multivibrator signals to develop a second integration signal, and said differential amplifier means being responsive to said first and second integration signals to differentially amplify the same.

8. The pulse counter detector of claim 7 wherein, said transistors and said resistors forming said first circuit means are interconnected to form first phase inverter circuit means and trigger circuit means coupling said phase inverter circuit means to said monostable multivibrator circuit means, said transistors and resistors forming said second circuit means being interconnected to form a second phase inverter means coupling said monostable multivibrator circuit means to said second integration circuit means, the pulse counter detector further including first and second capacitors positioned external to said integrated circuit die and coupled to said first and second integrating circuit means respectively, third and fourth capacitor means positioned external to said integrator circuit die and coupled to said multivibrator circuit means, and fifth capacitor means positioned external to said integrated circuit die and coupling said multivibrator circuit means to said second phase inverter means.

References Cited

UNITED STATES PATENTS

| | | | |
|---|---|---|---|
| Re. 26,210 | 5/1967 | Russell | 329—103 |
| 3,136,953 | 6/1964 | Eaton et al. | 329—126 |
| 3,355,669 | 11/1967 | Avins | 329—103 |

ALFRED L. BRODY, Primary Examiner

U.S. Cl. X.R.

307—233; 324—78; 325—325; 328—109, 140; 329—103